(12) United States Patent
Sakib et al.

(10) Patent No.: US 11,143,818 B2
(45) Date of Patent: Oct. 12, 2021

(54) MULTI-MODE INTERFERENCE (MMI) BASED LASER DEVICES FOR HETEROGENEOUS PLATFORMS

(71) Applicants: Meer Nazmus Sakib, Berkeley, CA (US); Guan-Lin Su, Union City, CA (US); John Heck, Berkeley, CA (US); Haisheng Rong, Pleasanton, CA (US); Ming C. Wu, Moraga, CA (US)

(72) Inventors: Meer Nazmus Sakib, Berkeley, CA (US); Guan-Lin Su, Union City, CA (US); John Heck, Berkeley, CA (US); Haisheng Rong, Pleasanton, CA (US); Ming C. Wu, Moraga, CA (US)

(73) Assignees: INTEL CORPORATION, Santa Clara, CA (US); REGENTS OF THE UNIVERSITY OF CALIFORNIA, Oakland, CA (US)

(*) Notice: Subject to any disclaimer, the term of this patent is extended or adjusted under 35 U.S.C. 154(b) by 142 days.

(21) Appl. No.: 16/457,483

(22) Filed: Jun. 28, 2019

(65) Prior Publication Data
US 2019/0324210 A1    Oct. 24, 2019

(51) Int. Cl.
*G02B 6/28* (2006.01)
*H01S 5/40* (2006.01)
(Continued)

(52) U.S. Cl.
CPC ....... *G02B 6/2813* (2013.01); *G02B 6/12004* (2013.01); *H01S 3/108* (2013.01);
(Continued)

(58) Field of Classification Search
CPC . G02B 6/2813; G02B 6/12004; H01S 5/4062; H01S 5/141; H01S 3/108;
(Continued)

(56) References Cited

U.S. PATENT DOCUMENTS

| | | | | |
|---|---|---|---|---|
| 2005/0244994 | A1* | 11/2005 | Meliga | H01S 5/125 438/22 |
| 2014/0153600 | A1* | 6/2014 | Luo | B82Y 20/00 372/40 |
| 2014/0192394 | A1* | 7/2014 | Sun | G02B 6/26 359/289 |
| 2018/0226767 | A1* | 8/2018 | Takabayashi | H01S 5/141 |

OTHER PUBLICATIONS

Guan-Lin Su et al., "Widely tunable semiconductor lasers with three interferometric arms," Optics Express, (2017), vol. 25, No. 18, pp. 21400-21409 (Year: 2017).*

(Continued)

*Primary Examiner* — Xinning(Tom) Niu
(74) *Attorney, Agent, or Firm* — Schwabe, Williamson & Wyatt, P.C.

(57) ABSTRACT

Embodiments include apparatuses, methods, and systems including a laser device having a 1×3 MMI coupler within a semiconductor layer. A front arm is coupled to the MMI coupler and terminated by a front reflector. In addition, a coarse tuning arm is coupled to the MMI coupler and terminated by a first back reflector for coarse wavelength tuning, a fine tuning arm is coupled to the MMI coupler and terminated by a second back reflector for fine wavelength tuning, and a SMSR and power tuning arm is coupled to the MMI coupler and terminated by a third back reflector. A gain region is above the front arm and above the semiconductor layer. Other embodiments may also be described and claimed.

22 Claims, 7 Drawing Sheets

(51) Int. Cl.
  *G02B 6/12* (2006.01)
  *H01S 5/14* (2006.01)
  *H01S 3/108* (2006.01)
  *H01S 5/10* (2021.01)

(52) U.S. Cl.
  CPC ............ *H01S 5/1007* (2013.01); *H01S 5/141* (2013.01); *H01S 5/4062* (2013.01)

(58) Field of Classification Search
  CPC .. H01S 5/1032; H01S 5/0617; H01S 2301/02; H01S 5/0612; H01S 5/021; H01S 3/0823; H01S 5/142; H01S 5/1007
  See application file for complete search history.

(56) References Cited

OTHER PUBLICATIONS

Ludovic Caro et al., "An MMI-based Tunable Laser for Integrated Photonic Circuits," Conference on Lasers and Electro-Optics, (2018), 2 pages.
Guan-Lin Su et al., "Widely tunable semiconductor lasers with three interferometric arms," Optics Express, (2017), vol. 25, No. 18, 10 pages.
Quanan Chen et al., "1×8 MMI based multi-channel interference laser integrated with SOA through a 2-port multimode interference reflector," Optics Express, (2018), vol. 26, No. 16, 10 pages.
Domenico D'Agostino et al., "Widely tunable multimode-interference based coupled cavity laser with integrated interferometer," Optics Express, (2018), vol. 26, No. 11, 15 pages.

* cited by examiner

MULTI-MODE INTERFERENCE (MMI) BASED LASER DEVICES FOR HETEROGENEOUS PLATFORMS

FIELD

Embodiments of the present disclosure generally relate to the field of optoelectronics and, more particularly, to optoelectronics in heterogeneous semiconductor platforms.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Growing demands for increasing optical bandwidth may require cost-effective circuits and systems solutions. One option for such cost-effective solutions may be the integration of photonic components on a single chip to form photonic integrated circuits (PICs). A laser device may be a building block of many kinds of PICs. Widely tunable semiconductor laser devices enable a large number of applications, including optical communications with wavelength-division multiplexing (WDM), coherent optical communications system, spectroscopy, gas sensing, and light detection and ranging (LiDAR). For example, some tunable laser devices may be based on multimode-interference (MMI) cavities fabricated using III-V materials. However, such tunable laser devices may have limited performance for various reasons. In addition, it may be difficult to integrate such laser devices with other photonic components based on the current technologies.

BRIEF DESCRIPTION OF THE DRAWINGS

Embodiments of the photonic integrated circuits with on-chip optical isolator techniques of the present disclosure may overcome these limitations with reduced insertion loss and easier manufacturing process. The techniques will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

A laser device may be a building block of photonic integrated circuits (PICs) or many other devices and systems. A tunable laser device is a laser device whose wavelength of operation can be altered in a controlled manner. There are many types and categories of tunable laser devices, such as single section tuning, multi-section tuning, narrowband tuning, and widely tunable laser devices. For example, laser devices based on sample grating distributed Bragg reflector (SG-DBR) may have a large tunable range by the use of vernier tunable Bragg mirrors.

Currently, multimode-interference (MMI) based laser devices may be fabricated using III-V materials, e.g., InGaAsP/InP, on an III-V platform. However, such laser devices may have unsatisfactory performance and are treated as a low-cost alternative to grating-based laser devices. In detail, MMI-based laser devices implemented on an III-V platform may generally suffer from high losses when etched facets are used as reflectors, and the MMI section may need to be supplied with high currents to compensate for its absorption loss if no active/passive integration measure is taken. On III-V platforms, wavelength tuning is typically realized by current injection that is nonlinear with excess losses. The refractive index change of the laser device caused by current injection may have limited tuning range due to the accompanying thermal effects caused by the current injections. In addition, MMI-based laser devices implemented on III-V platforms may be difficult to integrate with other on-chip photonic components.

On the other hand, widely tunable lasers based on wavelength-selective mirrors, e.g. sampled-grating Bragg reflectors and micro-ring resonators, have been realized on heterogeneous semiconductor platforms. However, they may suffer from non-negligible scattering loss or nonlinear optical effects under high optical power.

Embodiments herein present three-branch MMI tunable laser devices on a hybrid III-V/Si platform that allows for low-loss facet-less loop mirrors, low-loss passive silicon waveguides, MMI couplers as well as thermo-optic phase shifters in the laser cavity for laser wavelength tuning without introducing excess losses. In detail, embodiments herein implement three-branch MMI-based tunable laser devices on heterogeneous semiconductor platforms, which may also be called hybrid III-V/Si platforms. Three-branch MMI-based tunable laser devices offer high side-mode suppression ratios (SMSRs) while maintaining a wide tuning range and a low threshold modal gain of the lasing mode. In addition, the choices of different reflectors, e.g., loop mirrors, together with the three-branch MMI couplers, and additional phase tuner implemented in the three different tuning arms and in the loop mirrors as reflectors, can achieve higher performance beyond what have been reported by previously laser devices. In detail, embodiments herein use low-loss facet-less loop mirrors, low-loss passive silicon waveguides, three-branch MMI couplers, in addition to thermo-optic phase shifters in the laser cavity for laser wavelength tuning without introducing excess losses. In addition, photodetectors (PD) are integrated into waveguides as power monitors for laser control. Accordingly, embodiments herein present semiconductor widely tunable laser device having a threshold current of 5 mA to 15 mA, a peak wall-plug efficiency (WPE) of 15% to 20%, a maximum output power of 25 mW to 40 mW, a wavelength tuning range of 25 nm to 40 nm, and a SMSR of 35 dB to 50 dB in O-band. Previously reported widely tunable laser devices fabricated on heterogeneous semiconductor platforms would not be able to achieve the performance for the embodiments herein. For example, previously reported widely tunable MMI-based laser devices fabricated on heterogeneous semiconductor platforms may only operate in C-band, not in O-band. Embodiments herein may enable low-cost and efficient tunable laser devices fabricated on silicon photonics platform used in photonics products for data center interconnect and LiDAR for autonomous driving.

In various embodiments, a semiconductor photonic device includes a substrate, a gain region above the substrate, and a semiconductor layer above the substrate and below the gain region. The gain region includes an III-V material. The semiconductor layer includes a 1×3 MMI coupler. A front arm is coupled to the MMI coupler and terminated by a front reflector at a first side of the MMI coupler. In addition, a coarse tuning arm is coupled to the MMI coupler and terminated by a first back reflector for coarse wavelength tuning, a fine tuning arm is coupled to the MMI coupler and terminated by a second back reflector for fine wavelength tuning, and a SMSR and power tuning arm is coupled to the MMI coupler and terminated by a third back reflector. The gain region is above the front arm. The coarse tuning arm, the fine tuning arm, and the SMSR and power tuning arm are coupled to the MMI coupler at a second side of the MMI coupler opposite to the first side.

In various embodiments, a method for forming a semiconductor photonic device includes forming a 1×3 MMI coupler with an output port at a first side of the MMI coupler, and three input ports at a second side of the MMI coupler opposite to the first side. The MMI coupler is within a semiconductor layer above a substrate. The method further includes forming, within the semiconductor layer, a front arm coupled to the output port of the MMI coupler and terminated by a front reflector; and forming, within the semiconductor layer, a coarse tuning arm coupled to a first input port of the MMI coupler and terminated by a first back reflector for coarse wavelength tuning, a fine tuning arm coupled to a second input port of the MMI coupler and terminated by a second back reflector for fine wavelength tuning, and a SMSR and power tuning arm coupled to a third input port of the MMI coupler and terminated by a third back reflector. In addition, the method includes forming a gain region in an III-V material layer including an III-V material above the semiconductor layer, wherein the gain region is above the front arm.

In various embodiments, an optical communication system includes at least one optical apparatus, where the optical apparatus includes a single mode laser device. The single mode laser device includes a substrate, a gain region disposed above the substrate, and a semiconductor layer above the substrate and below the gain region. The gain region includes an III-V material. The semiconductor layer includes a 1×3 MMI coupler. A front arm is coupled to the MMI coupler and terminated by a front reflector at a first side of the MMI coupler. In addition, a coarse tuning arm is coupled to the MMI coupler and terminated by a first back reflector for coarse wavelength tuning, a fine tuning arm is coupled to the MMI coupler and terminated by a second back reflector for fine wavelength tuning, and a SMSR and power tuning arm is coupled to the MMI coupler and terminated by a third back reflector. The gain region is disposed above the front arm. The coarse tuning arm, the fine tuning arm, and the SMSR and power tuning arm are coupled to the MMI coupler at a second side of the MMI coupler opposite to the first side.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1:
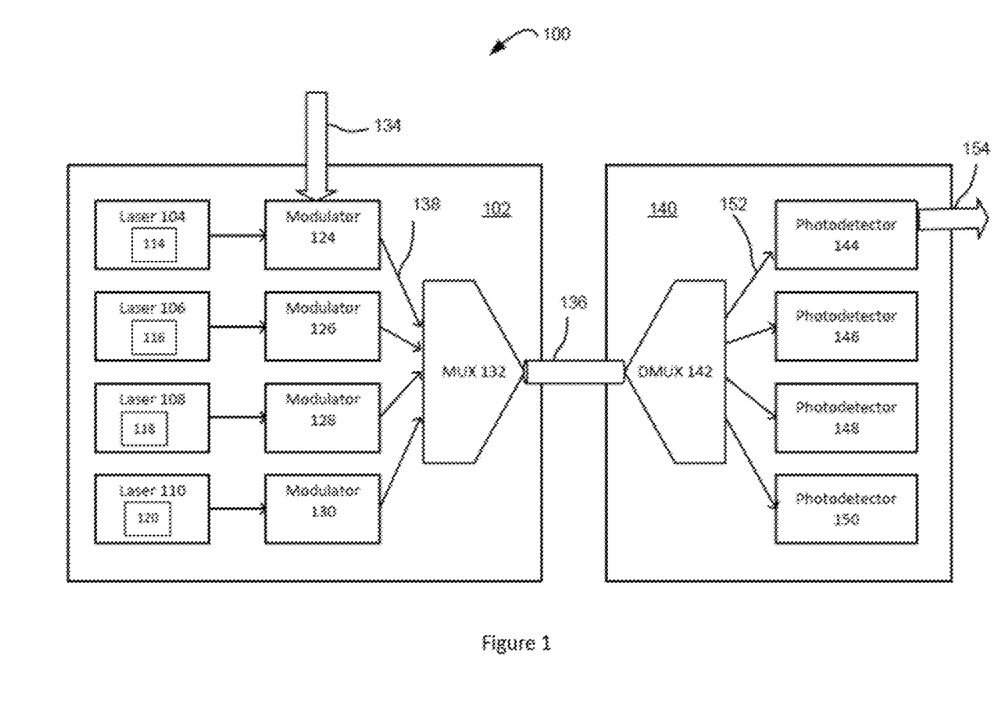
FIG. 1 schematically illustrates an example communication system that utilizes multi-mode interference (MMI) based laser devices, according to various embodiments.

FIG. 1 schematically illustrates an example communication system that utilizes MMI-based laser devices, according to various embodiments. The system 100 includes a transmitter chip 102, configured to transmit data to a receiver chip 140. In embodiments, the transmitter chip 102 comprises a PIC with one or more on-chip laser devices 104, 106, 108, 110. In embodiments, one or more of the laser devices 104, 106, 108, 110 include 1×3 MMI couplers (e.g., 1×3 MMI couplers 114, 116, 118, 120 respectively) provided according to the designs shown in FIGS. 2-4, in accordance with embodiments described herein. It will be understood that the number of on-chip laser devices may vary according to technological needs and constraints; the laser devices 104, 106, 108, 110 with respective 1×3 MMI couplers 114, 116, 118, 120 are shown for purposes of illustration.

In embodiments, the transmitter chip 102 further includes optical modulators 124, 126, 128, 130 optically coupled with the laser devices 104, 106, 108, 110 respectively. The outputs of the modulators 124, 126, 128, 130 may couple with a multiplexer (MUX) 132. It should be understood that the chip 102 (and receiver chip 140) may include other components (e.g., processors, memory, etc.) that are not shown herein for ease of explanation.

In operation, the optical signals provided by the laser devices 104, 106, 108, 110 may be modulated with electronic data inputs, provided to the modulators (one of the electronic data inputs 134, provided to the modulator 124, is shown for purposes of clarity). The optical signals carrying the data information (e.g., 138) are multiplexed by the multiplexer 132 and the resulting data signal may be provided to an optical data communication channel 136 (e.g., optical fiber cable) for transmission. In embodiments, the length of the optical channel 136 may vary, e.g., from a few meters to a few kilometers.

On the receiver chip 140 side, the optical signal may be de-multiplexed by the demultiplexer (DMUX) 142, and de-multiplexed optical data signals (e.g., 152) may be provided to respective photodetectors 144, 146, 148, 150. The photodetectors 144, 146, 148, 150 may convert received optical data signals into an electronic form and provide resulting electronic data signals (e.g., 154) for further processing.

In embodiments, the laser devices with 1×3 MMI couplers (e.g., laser device 104 with the 1×3 MMI coupler 114) according to the embodiments described herein may present a semiconductor widely tunable laser device having a threshold current of 5 mA to 15 mA, a peak wall-plug efficiency (WPE) of 15% to 20%, a maximum output power of 25 mW to 40 mW, a wavelength tuning range of 25 nm to 40 nm, and a SMSR of 35 dB to 50 dB in O-band. In addition or in the alternative to the example system 100 described above, the laser devices with 1×3 MMI couplers may be used in optical transceivers, Light Detection and Ranging (LiDAR), optical and quantum computing systems, and the like.

Figure 2:
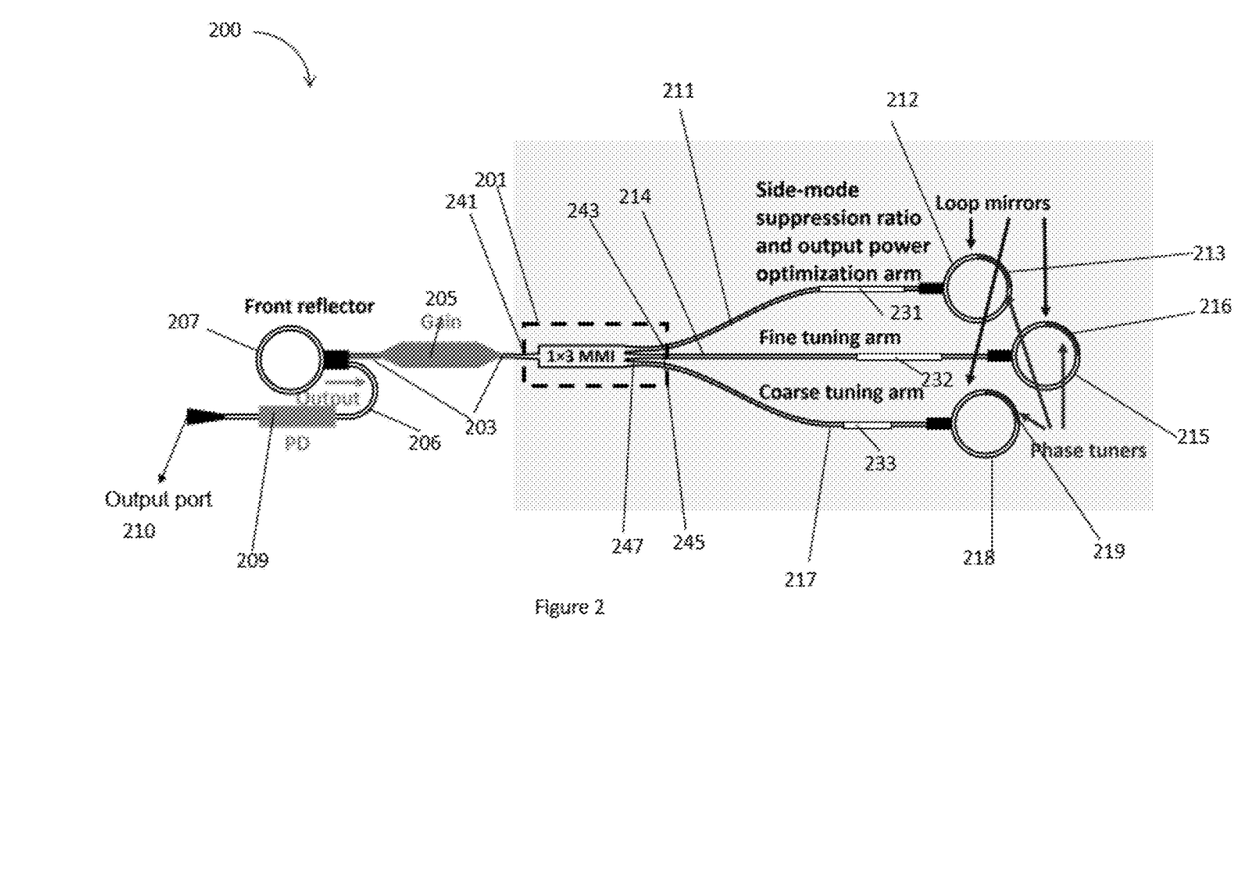
FIG. 2 schematically illustrates a block diagram of a MMI-based laser device, according to various embodiments.

FIG. 2 schematically illustrates a block diagram of a MMI-based laser device 200, according to various embodiments. In embodiments, the MMI-based laser device 200 may be examples of the laser devices 104, 106, 108, and 110, as shown in FIG. 1, and perform similar functions respectively. In embodiments, the laser device 200 may be single mode laser device.

In embodiments, the laser device 200 includes a 1×3 MMI coupler 201, where the MMI coupler 201 includes an output port 241 at a first side of the MMI coupler 201, and three input ports, 243, 245, and 247, at a second side of the MMI coupler 201 opposite to the first side. The MMI coupler 201 may be a self-imaging, lossless MMI coupler. A front arm 203 is coupled to the MMI coupler 201 and terminated by a front reflector 207 at the first side of the MMI coupler 201. A coarse tuning arm 217 is coupled to the MMI coupler 201 at the second side and terminated by a first back reflector 218 for coarse wavelength tuning, a fine tuning arm 214 is coupled to the MMI coupler 201 at the second side and terminated by a second back reflector 215 for fine wavelength tuning, and a side-mode suppression ratio (SMSR) and power tuning arm 211 is coupled to the MMI coupler 201 at the second side and terminated by a third back reflector 212. The fine tuning arm 214 is longer than the coarse tuning arm 217 and longer than the SMSR and power tuning arm 211. An output port 210 is coupled to the front reflector 207. The three-branch 1×3 MMI coupler 201, together with the three different arms, e.g., the coarse tuning arm 217, the fine tuning arm 214, and the SMSR and power tuning arm 211 may work together to produce a sharp optical interference pattern that increases the SMSRs of the supermodes. The inclusion of the long fine tuning 214, which implements fine tuning, allows one to simultaneously achieve a wide tuning range, high SMSRs, and a low threshold modal gain of the lasing mode.

In embodiments, the front arm 203, the coarse tuning arm 217, the fine tuning arm 214, or the SMSR and power tuning arm 211 includes a silicon waveguide selected from a group consisting of a slab waveguide, a strip waveguide, a rib waveguide, or a surface ridge waveguide. The silicon waveguide of the coarse tuning arm 217, the fine tuning arm 214, or the SMSR and power tuning arm 211 includes doped silicon as a phase tuner to perform tuning of the laser device 200. For example, the coarse tuning arm 217 includes a doped silicon area 233, the fine tuning arm 214 includes a doped silicon area 232, and the SMSR and power tuning arm 211 includes a doped silicon area 231. A photodetector 209 is in a waveguide 206 between the front reflector 207 and the output port 210 as a power monitor at the output port 210.

In embodiments, a gain region 205 is disposed above the front arm 203. The gain region 205 may include an III-V material selected from the group consisting of aluminum (Al), gallium (Ga), indium (In), nitrogen (N), phosphorus (P), arsenic (As), antimony (Sb), AlAs, GaAs, $In_xGa_{1-x}As$, $In_xAl_{1-x}As$, $In_xGa_{1-x}P$, $In_xAl_{1-x}P$, $GaAs_xSb_{1-x}$, $Al_xGa_{1-x}As_yP_{1-y}$, and $Al_xIn_yGa_{1-x-y}As$, where x and y are between 0 and 1, InSb, InAs, AlP, GaP, InP, a binary III-V compound, a ternary III-V compound, and a quaternary III-V compound.

In embodiments, the front reflector 207, the first back reflector 218, the second back reflector 215, or the third back reflector 212, may include a loop mirror having silicon, a metal reflector, or a grating-based reflector. For example, the first back reflector 218 may be a loop mirror including doped silicon 219 as a phase tuner, the second back reflector 215 may be a loop mirror including doped silicon 216 as a phase tuner, and the third back reflector 212 may be a loop mirror including doped silicon 213 as a phase tuner.

In embodiments, the 1×3 MMI coupler 201 combines the optical waves experiencing different phase shifts after traveling through the three tuning arms, e.g., the coarse tuning arm 217, the fine tuning arm 214, or the SMSR and power tuning arm 211, and reflected by the back reflectors. Together they act as a compound mirror or reflector with wavelength selectivity for single mode lasing. By implementing phase tuners in the three tuning arms and the three loop mirrors as the back reflectors, the lasing wavelength can be tuned. The three back reflectors may be Sagnac loop reflectors with low loss silicon waveguides. The optical phase tuners are realized using doped silicon waveguides as resistive heaters. The photodetector 209 is integrated in the waveguide 206 as a power monitor at the output port 210 of the laser device 200.

Figure 3A:
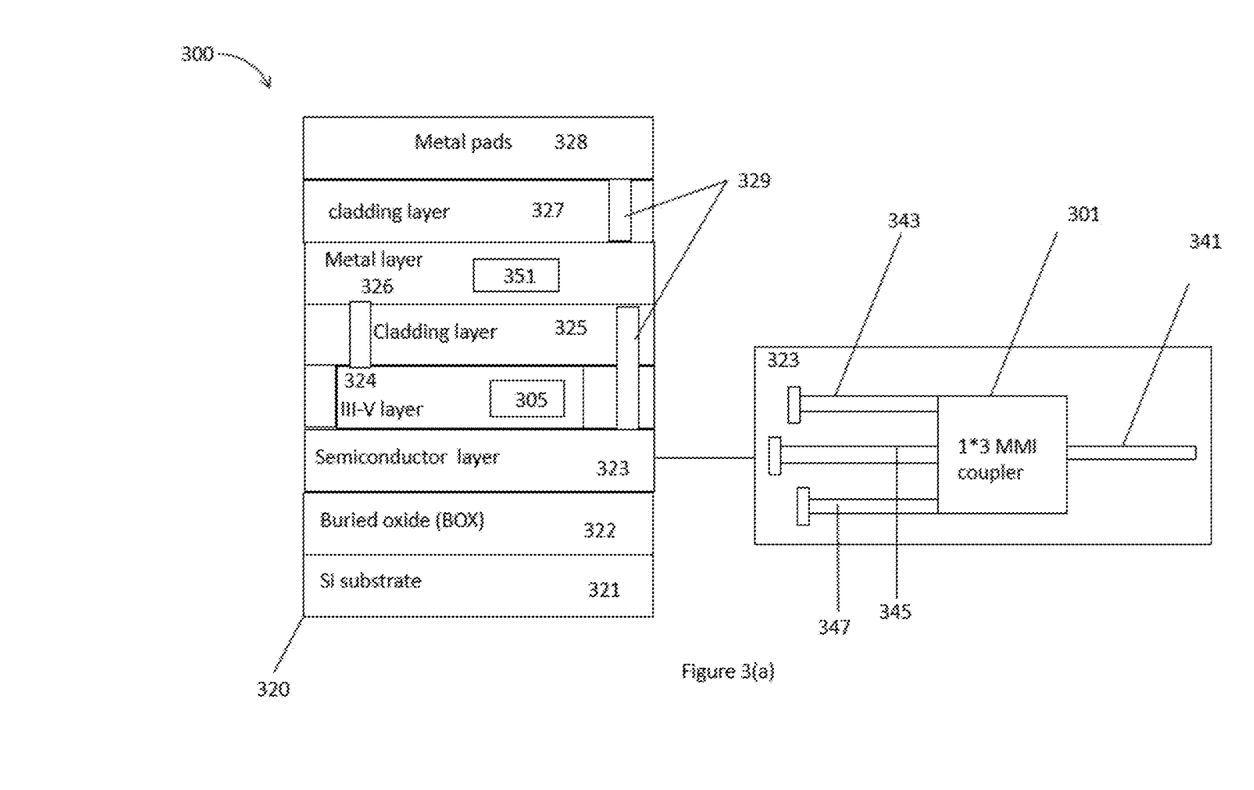
FIGS. 3(a)-3(c) schematically illustrate a layout of a MMI-based laser device in a heterogeneous semiconductor platform, according to various embodiments.
Figure 3B:
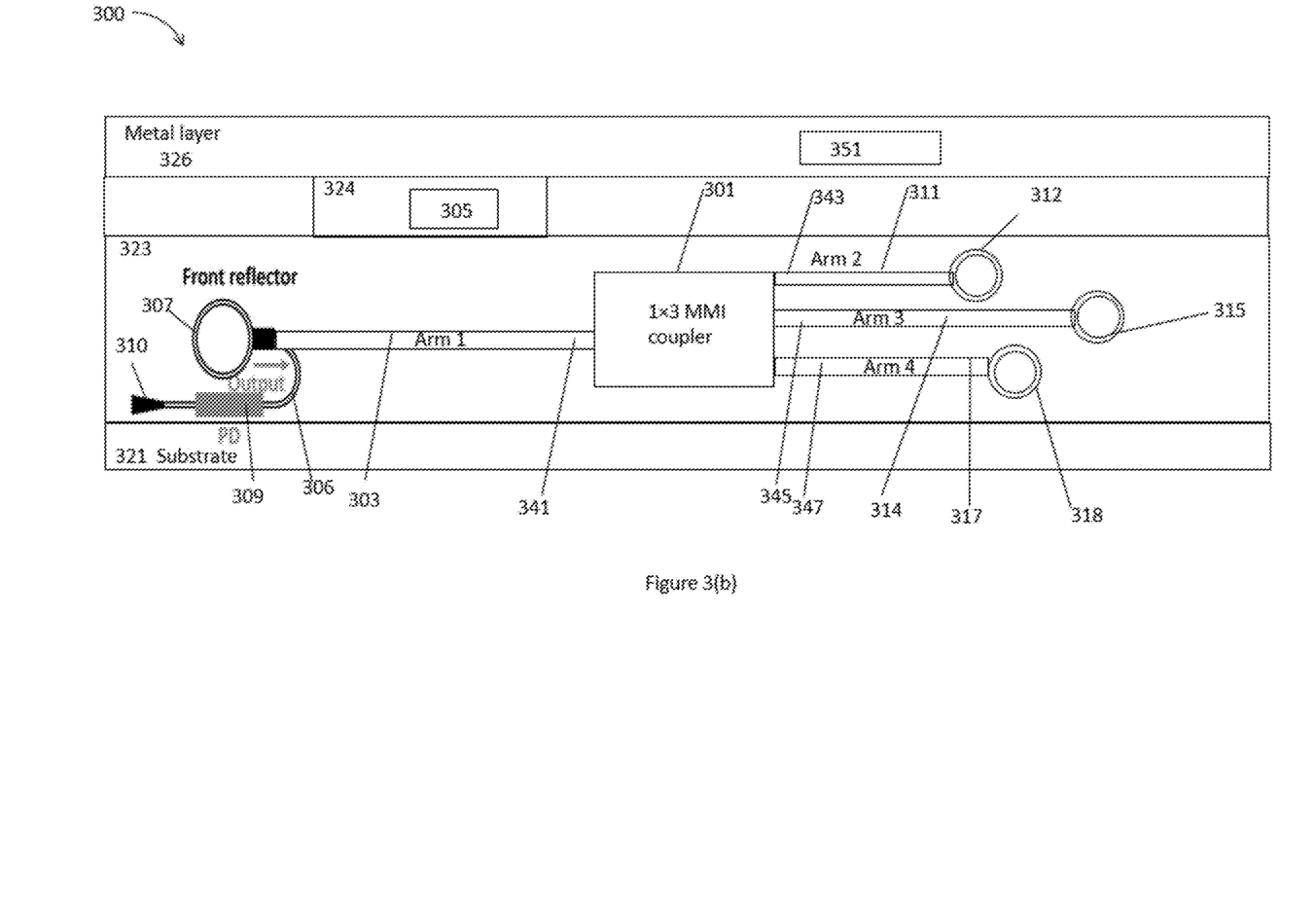
Figure 3C:
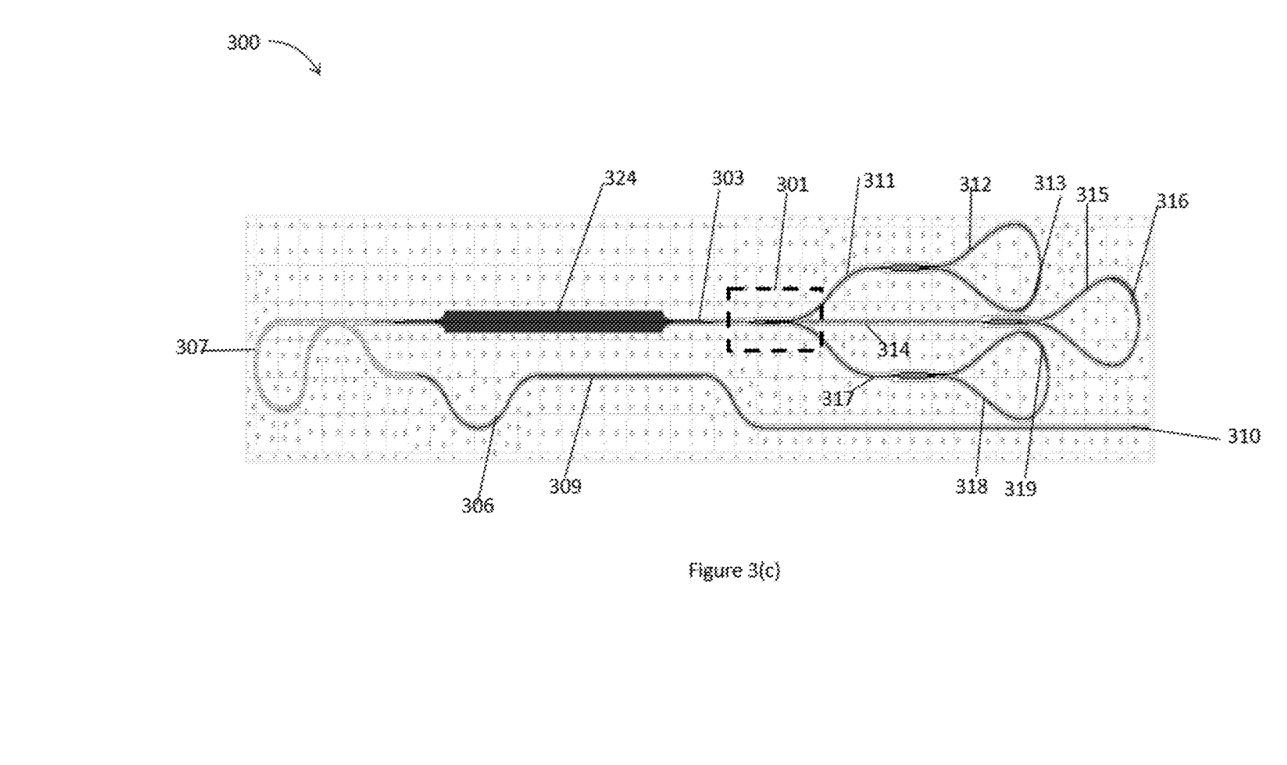

FIGS. 3(a)-3(c) schematically illustrate a layout of a MMI-based laser device 300 in a heterogeneous semiconductor platform 320, according to various embodiments. In embodiments, the laser device 300 may be an example of the laser device 200 as shown in FIG. 2, or the laser devices 104, 106, 108, and 110, as shown in FIG. 1.

In embodiments, as shown in FIG. 3(a), the laser device 300 is fabricated in the heterogeneous semiconductor platform 320 including various layers. For example, the heterogeneous semiconductor platform 320 includes a substrate 321, a buried oxide layer 322 above the substrate 321, a semiconductor layer 323 above the buried oxide layer 322, an III-V material layer 324 above the semiconductor layer 323, a cladding layer 325 above the III-V material layer 324, a metal layer 326 above the cladding layer 325, a cladding layer 327 above the metal layer 326, and a layer of metal pads 328 above the cladding layer 327. Various components, e.g., via 329, may be formed within the layers or through the layers. The various layers shown for the heterogeneous semiconductor platform 320 are for examples only and are not limiting. There may be fewer or more layers for the heterogeneous semiconductor platform 320.

In embodiments, the semiconductor layer 323 may include silicon, or an III-V material. A 1×3 MMI coupler 301 may be embedded within the semiconductor layer 323, which may be a low-loss silicon region. The MMI coupler 301 includes an output port 341 at a first side of the MMI coupler 301, and three input ports, 343, 345, and 347, at a second side of the MMI coupler 301 opposite to the first side. The MMI coupler 301 may be a self-imaging, lossless MMI coupler. There is a gain region 305 within the III-V material layer 324. The cladding layer 325 is above the gain region 305 and the III-V material layer 324. In addition, the metal layer includes one or more metal heaters 351 to act as phase tuners for the laser device 300.

In embodiments, as shown in FIG. 3(b), within the semiconductor layer 323, a front arm 303 is coupled to the MMI coupler 301 and terminated by a front reflector 307 at the first side of the MMI coupler 301. A coarse tuning arm 317 is coupled to the MMI coupler 301 at the second side and terminated by first back reflector 318 for coarse wavelength tuning, a fine tuning arm 314 is coupled to the MMI coupler 301 at the second side and terminated by a second back reflector 315 for fine wavelength tuning, and a SMSR and power tuning arm 311 is coupled to the MMI coupler 301 at the second side and terminated by a third back reflector 312. The fine tuning arm 314 is longer than the coarse tuning arm 317 and longer than the SMSR and power tuning arm 311. An output port 310 is coupled to the front reflector 307 through a waveguide 306. A photodetector 309 is integrated into the waveguide 306 between the front reflector 307 and the output port 310 as a power monitor at the output port 310.

In embodiments, the gain region 305 is within the III-V material layer 324 and is above the front arm 303. The gain region 305 may include an III-V material. The front arm 303, the coarse tuning arm 317, the fine tuning arm 314, or the SMSR and power tuning arm 311 includes a silicon waveguide that may have doped silicon as a phase tuner to perform tuning of the laser device 300. The front reflector 307, the first back reflector 318, the second back reflector 315, or the third back reflector 312, may include a loop mirror having silicon, a metal reflector, or a grating-based reflector. For example, the first back reflector 318 may be a loop mirror including doped silicon as a phase tuner, the second back reflector 315 may be a loop mirror including doped silicon as a phase tuner, and the third back reflector 312 may be a loop mirror including doped silicon as a phase tuner. In addition, the metal layer 326 includes one or more metal heaters 351 to act as phase tuners for the laser device 300, above the coarse tuning arm 317, the fine tuning arm 314, or the SMSR and power tuning arm 311.

FIG. 3(c) shows a top-down view of the laser device 300 fabricated in a heterogeneous semiconductor platform 320 including various layers. The laser device 300 includes the 1×3 MMI coupler 301. The front arm 303 is coupled to the MMI coupler 301 and terminated by the front reflector 307 at the first side of the MMI coupler 301. The coarse tuning arm 317 is coupled to the MMI coupler 301 at the second side and terminated by the first back reflector 318 for coarse wavelength tuning, the fine tuning arm 314 is coupled to the MMI coupler 301 at the second side and terminated by a second back reflector 315 for fine wavelength tuning, and the SMSR and power tuning arm 311 is coupled to the MMI coupler 301 at the second side and terminated by a third back reflector 312. The output port 310 is coupled to the front reflector 307 by a waveguide 306. The photodetector 309 is integrated into the waveguide 306 between the front reflector 307 and the output port 310 as a power monitor at the output port 310. In embodiments, the coarse tuning arm 317, the fine tuning arm 314, and the SMSR and power tuning arm 311 may include a doped silicon area as a phase tuner. In addition, the first back reflector 318 may be a loop mirror including doped silicon 319 as a phase tuner, the second back reflector 315 may be a loop mirror including doped silicon 316 as a phase tuner, and the third back reflector 312 may be a loop mirror including doped silicon 313 as a phase tuner. There may be other components of the laser device 300, not shown in FIG. 3(c).

Figure 4:
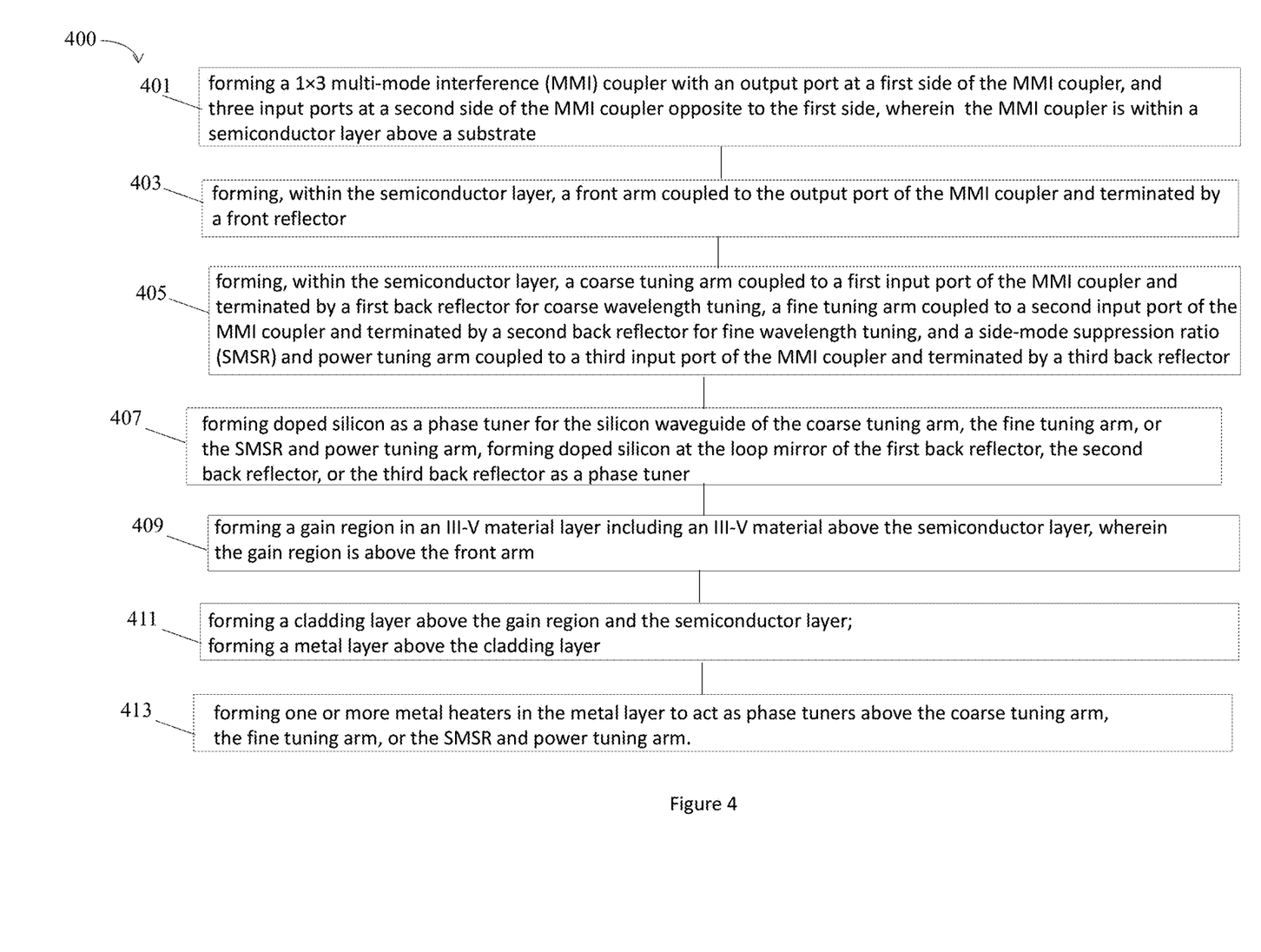
FIG. 4 schematically illustrates a flow diagram of a process for forming a MMI-based laser device in a heterogeneous semiconductor platform, according to various embodiments.

FIG. 4 schematically illustrates a flow diagram of a process 400 for forming a MMI-based laser device in a heterogeneous semiconductor platform, according to various embodiments. In embodiments, the process 400 may be performed to form the laser device 300 shown in FIGS. 3(a)-3(c), the laser device 200 as shown in FIG. 2, or the laser devices 104, 106, 108, and 110, as shown in FIG. 1.

At block 401, the process 400 may include forming a 1×3 MMI coupler with an output port at a first side of the MMI coupler, and three input ports at a second side of the MMI coupler opposite to the first side, wherein the MMI coupler is within a semiconductor layer above a substrate. For example, at the block 401, the process 400 may include forming the 1×3 MMI coupler 301 with the output port 341 at a first side of the MMI coupler, and three input ports, 343, 345, and 347, at a second side of the MMI coupler opposite to the first side, wherein the MMI coupler 301 is within the semiconductor layer 323 above the substrate 321, as shown in FIG. 3(b).

At block 403, the process 400 may include forming, within the semiconductor layer, a front arm coupled to the output port of the MMI coupler and terminated by a front reflector. For example, at the block 403, the process 400 may include forming, within the semiconductor layer 323, the front arm 303 coupled to the output port 341 of the MMI coupler 301 and terminated by the front reflector 307, as shown in FIG. 3(b).

At block 405, the process 400 may include forming, within the semiconductor layer, a coarse tuning arm coupled to a first input port of the MMI coupler and terminated by a first back reflector for coarse wavelength tuning, a fine tuning arm coupled to a second input port of the MMI coupler and terminated by a second back reflector for fine wavelength tuning, and a SMSR and power tuning arm coupled to a third input port of the MMI coupler and terminated by a third back reflector. For example, at the block 405, the process 400 may include forming, within the semiconductor layer 323, the coarse tuning arm 317 coupled to a first input port 347 of the MMI coupler 301 and terminated by the first back reflector 318 for coarse wavelength tuning, the fine tuning arm 314 coupled to a second input port 345 of the MMI coupler 301 and terminated by the second back reflector 315 for fine wavelength tuning, and the SMSR and power tuning arm 311 coupled to a third input port 343 of the MMI coupler 301 and terminated by the third back reflector 312, as shown in FIG. 3(b).

At block 407, the process 400 may include forming doped silicon as a phase tuner for the silicon waveguide of the coarse tuning arm, the fine tuning arm, or the SMSR and power tuning arm, forming doped silicon at the loop mirror of the first back reflector, the second back reflector, or the third back reflector as a phase tuner. For example, at the block 409, the process 400 may include forming doped silicon as a phase tuner for the silicon waveguide of the coarse tuning arm 317, the fine tuning arm 314, or the SMSR and power tuning arm 311, forming doped silicon at the loop mirror of the first back reflector 318, the second back reflector 315, or the third back reflector 312 as a phase tuner, as shown in FIG. 3(b).

At block 409, the process 400 may include forming a gain region in an III-V material layer including an III-V material above the semiconductor layer, wherein the gain region is above the front arm. For example, at the block 407, the process 400 may include forming the gain region 305 in the III-V material layer 324 including an III-V material above the semiconductor layer 323, wherein the gain region 305 is above the front arm 303, as shown in FIG. 3(b).

At block 411, the process 400 may include forming a cladding layer above the gain region and the semiconductor layer; and forming a metal layer above the cladding layer. For example, at the block 411, the process 400 may include forming the cladding layer 325 above the gain region 305 and the semiconductor layer 323; and forming the metal layer 326 above the cladding layer 325.

At block 413, the process 400 may include forming one or more metal heaters in the metal layer to act as phase tuners above the coarse tuning arm, the fine tuning arm, or the SMSR and power tuning arm. For example, at the block 413, the process 400 may include forming one or more metal heaters 351 in the metal layer 326 to act as phase tuners above the coarse tuning arm 317, the fine tuning arm 314, or the SMSR and power tuning arm 311, as shown in FIGS. 3(a) and 3(b).

Figure 5:
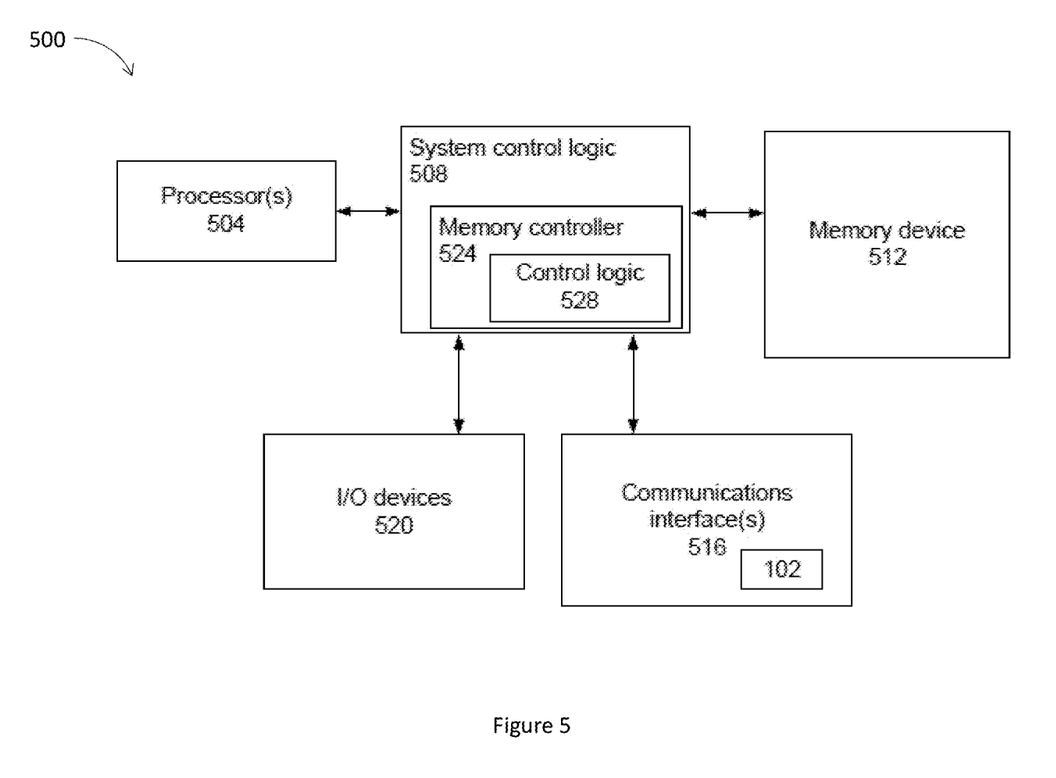
FIG. 5 schematically illustrates an exemplary computing and an optical device with a MMI-based laser device for use with various components and processes of FIGS. 1-4, according to various embodiments.

FIG. 5 schematically illustrates an exemplary computing and an optical device 500 with including a laser device for use with various components and processes of FIGS. 1-4, such as the laser device 300 shown in FIGS. 3(a)-3(c), the laser device 200 as shown in FIG. 2, or the laser devices 104, 106, 108, and 110, as shown in FIG. 1, according to various embodiments.

The computing device 500 includes system control logic 508 coupled to one or more processor(s) 504; a memory device 512; one or more communications interface(s) 516; and input/output (I/O) devices 520. The memory device 512 may be a non-volatile computer storage chip (e.g., provided on the die). The memory device 512 may be configured to be removably or permanently coupled with the computing device 500.

Communications interface(s) 516 may provide an interface for computing device 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network. In embodiments, communication interface(s) 516 may include, or couple with, a transceiver, such as transmitter chip 102 of FIG. 1, including one or more laser devices (e.g., 104, 106, 108, 110) with a three-branch MMI coupler, according to the embodiments described herein.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 524 to provide an interface to the memory device 512 to control various memory access operations. The memory controller 524 may include control logic 528 that may be specifically configured to control access of the memory device 512.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the computing device 500 may be a mobile computing device such as, but not limited to, a laptop computing device, a tablet computing device, a netbook, a smartphone, etc.; a desktop computing device; a workstation; a server; etc. The computing device 500 may have more or fewer components, and/or different architectures. In further implementations, the computing device 500 may be any other electronic device that processes data.

EXAMPLES

Example 1 may include a semiconductor photonic device, comprising: a substrate; a gain region disposed above the substrate; a semiconductor layer disposed above the substrate and below the gain region, wherein the semiconductor layer includes a 1×3 multi-mode interference (MMI) coupler, a front arm coupled to the MMI coupler and terminated by a front reflector at a first side of the MMI coupler, a coarse tuning arm terminated by a first back reflector for coarse wavelength tuning, a fine tuning arm terminated by a second back reflector for fine wavelength tuning, and a side-mode suppression ratio (SMSR) and power tuning arm terminated by a third back reflector for power tuning, and wherein the gain region is above the front arm, and wherein the coarse tuning arm, the fine tuning arm, and the SMSR and power tuning arm are coupled to the MMI coupler at a second side of the MMI coupler opposite to the first side.

Example 2 may include the semiconductor photonic device of example 1 and/or some other examples herein, wherein the gain region includes an III-V material, and the semiconductor photonic device further comprises: an output port coupled to the front reflector.

Example 3 may include the semiconductor photonic device of example 2 and/or some other examples herein, further comprising: a photodetector in a waveguide between the front reflector and the output port as a power monitor at the output port.

Example 4 may include the semiconductor photonic device of example 1 and/or some other examples herein, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide.

Example 5 may include the semiconductor photonic device of example 4 and/or some other examples herein, wherein the silicon waveguide of the coarse tuning arm, the fine tuning arm, or the SMSR and power tuning arm includes doped silicon as a phase tuner.

Example 6 may include the semiconductor photonic device of example 1 and/or some other examples herein, wherein the gain region includes the III-V material selected from the group consisting of aluminum (Al), gallium (Ga), indium (In), nitrogen (N), phosphorus (P), arsenic (As), antimony (Sb), AlAs, GaAs, $In_xGa_{1-x}As$, $In_xAl_{1-x}As$, $In_xGa_{1-x}P$, $In_xAl_{1-x}P$, $GaAs_xSb_{1-x}$, $Al_xGa_{1-x}As_yP_{1-y}$, and $Al_{x-}In_yGa_{1-x-y}As$, where x and y are between 0 and 1, InSb, InAs, AlP, GaP, InP, a binary III-V compound, a ternary III-V compound, and a quaternary III-V compound.

Example 7 may include the semiconductor photonic device of example 1 and/or some other examples herein, wherein the semiconductor layer includes silicon, or an III-V material.

Example 8 may include the semiconductor photonic device of example 1 and/or some other examples herein, wherein the front reflector, the first back reflector, the second back reflector, or the third back reflector, includes a loop mirror having silicon, a metal reflector, or a grating-based reflector.

Example 9 may include the semiconductor photonic device of example 8 and/or some other examples herein, wherein the first back reflector, the second back reflector, or the third back reflector is a loop mirror including doped silicon as a phase tuner.

Example 10 may include the semiconductor photonic device of example 1 and/or some other examples herein, further comprising: a cladding layer above the gain region and the semiconductor layer.

Example 11 may include the semiconductor photonic device of example 10 and/or some other examples herein, further comprising: a metal layer above the cladding layer.

Example 12 may include the semiconductor photonic device of example 11 and/or some other examples herein, wherein the metal layer includes one or more metal heaters to act as phase tuners above the coarse tuning arm, the fine tuning arm, or the SMSR and power tuning arm.

Example 13 may include the semiconductor photonic device of example 1 and/or some other examples herein, wherein the semiconductor photonic device is for a single mode laser device.

Example 14 may include the semiconductor photonic device of example 1 and/or some other examples herein, wherein the MMI coupler is a self-imaging, lossless MMI coupler.

Example 15 may include the semiconductor photonic device of example 1 and/or some other examples herein, wherein the fine tuning arm is longer than the coarse tuning arm and longer than the SMSR and power tuning arm.

Example 16 may include a method for forming a semiconductor photonic device, comprising: forming a 1×3 multi-mode interference (MMI) coupler with an output port at a first side of the MMI coupler, and three input ports at a second side of the MMI coupler opposite to the first side, wherein the MMI coupler is within a semiconductor layer above a substrate; forming, within the semiconductor layer, a front arm coupled to the output port of the MMI coupler and terminated by a front reflector; forming, within the semiconductor layer, a coarse tuning arm coupled to a first input port of the MMI coupler and terminated by a first back reflector for coarse wavelength tuning, a fine tuning arm coupled to a second input port of the MMI coupler and terminated by a second back reflector for fine wavelength tuning, and a side-mode suppression ratio (SMSR) and power tuning arm coupled to a third input port of the MMI coupler and terminated by a third back reflector; and forming a gain region in an III-V material layer including an III-V material above the semiconductor layer, wherein the gain region is above the front arm.

Example 17 may include the method of example 16 and/or some other examples herein, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide; and wherein the first back reflector, the second back reflector, or the third back reflector is a loop mirror; and the method further comprises: forming doped silicon as a phase tuner for the silicon waveguide of the coarse tuning arm, the fine tuning arm, or the SMSR and power tuning arm; and forming doped silicon at the loop mirror of the first back reflector, the second back reflector, or the third back reflector as a phase tuner.

Example 18 may include the method of example 16 and/or some other examples herein, wherein the gain region including the III-V material is bonded to the semiconductor layer by direct bonding, eutectic bonding, or hybrid bonding.

Example 19 may include the method of example 16 and/or some other examples herein, further comprising: forming a cladding layer above the gain region and the semiconductor layer; forming a metal layer above the cladding layer; and forming one or more metal heaters in the metal layer to act as phase tuners above the coarse tuning arm, the fine tuning arm, or the SMSR and power tuning arm.

Example 20 may include an optical communication system comprising at least one optical apparatus, wherein the optical apparatus includes a single mode laser device, and the single mode laser device includes: a substrate; a gain region above the substrate, wherein the gain region includes an III-V material; a semiconductor layer above the substrate and below the gain region, wherein the semiconductor layer includes a 1×3 multi-mode interference (MMI) coupler, a front arm coupled to the MMI coupler and terminated by a front reflector at a first side of the MMI coupler, a coarse tuning arm terminated by a first back reflector for coarse wavelength tuning, a fine tuning arm terminated by a second back reflector for fine wavelength tuning, and a side-mode suppression ratio (SMSR) and power tuning arm terminated by a third back reflector, and wherein the gain region is above the front arm, and wherein the coarse tuning arm, the fine tuning arm, and the SMSR and power tuning arm are coupled to the MMI coupler at a second side of the MMI coupler opposite to the first side; and an output port coupled to the front reflector.

Example 21 may include the optical communication system of example 20 and/or some other examples herein, further comprising: a photodetector in a waveguide between the front reflector and the output port as a power monitor at the output port.

Example 22 may include the optical communication system of example 20 and/or some other examples herein, wherein the semiconductor layer includes silicon, or an III-V material; and wherein the gain region includes the III-V material selected from the group consisting of aluminum (Al), gallium (Ga), indium (In), nitrogen (N), phosphorus (P), arsenic (As), antimony (Sb), AlAs, GaAs, $In_xGa_{1-x}As$, $In_xGa_{1-x}P$, $GaAs_xSb_{1-x}$, $Al_xGa_{1-x}As_yP_{1-y}$, and $Al_xIn_y Ga_{1-x-y}As$ where x and y are between 0 and 1, InSb, InAs, AlP, GaP, InP, a binary III-V compound, a ternary III-V compound, and a quaternary III-V compound.

Example 23 may include the optical communication system of example 20 and/or some other examples herein, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide; and the silicon waveguide of the coarse tuning arm, the fine tuning arm, or the SMSR and power tuning arm includes doped silicon as a phase tuner.

Example 24 may include the optical communication system of example 20 and/or some other examples herein, wherein the first back reflector, the second back reflector, or the third back reflector is a loop mirror including doped silicon as a phase tuner.

Example 25 may include the optical communication system of example 20 and/or some other examples herein, wherein the single mode laser device further comprises: a cladding layer above the gain region and the semiconductor layer; and a metal layer above the cladding layer, wherein the metal layer includes one or more metal heaters to act as phase tuners above the coarse tuning arm, the fine tuning arm, or the SMSR and power tuning arm.

These modifications may be made to the disclosure in light of the above detailed description. The terms used in the following claims should not be construed to limit the disclosure to the specific implementation disclosed in the specification and the claims. Rather, the scope of the disclosure is to be determined entirely by the following claims, which are to be construed in accordance with established doctrines of claim interpretation.

The invention claimed is:

1. A semiconductor photonic device, comprising:
   a substrate;
   a gain region disposed above the substrate;
   a semiconductor layer disposed above the substrate and below the gain region, wherein the semiconductor layer includes:
   a 1×3 multi-mode interference (MMI) coupler,
   a front arm coupled to the MMI coupler and terminated by a front reflector at a first side of the MIMI coupler,
   a coarse tuning arm terminated by a first back reflector for coarse wavelength tuning,
   a fine tuning arm terminated by a second back reflector for fine wavelength tuning, and
   a side-mode suppression ratio (SMSR) and power tuning arm terminated by a third back reflector for power tuning,
   an output port coupled to the front reflector via a waveguide; and
   a photodetector integrated into the waveguide between the front reflector and the output port to monitor power at the output port;
   wherein the gain region is above the front arm, and wherein the coarse tuning arm, the fine tuning arm, and the SMSR and power tuning arm are coupled to the MMI coupler at a second side of the MMI coupler opposite to the first side; and
   a metal layer disposed above the gain region, wherein the metal layer includes one or more metal heaters, wherein the one or more metal heaters are disposed directly above the coarse tuning arm, the fine tuning arm, or the SMSR and power tuning arm in order to act as phase tuners for the semiconductor photonic device.

2. The semiconductor photonic device of claim 1, wherein the gain region includes an III-V material, and the semiconductor photonic device further comprises:
   an output port coupled to the front reflector.

3. The semiconductor photonic device of claim 1, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide.

4. The semiconductor photonic device of claim 3, wherein the silicon waveguide of the coarse tuning arm, the fine tuning arm, or the SMSR and power tuning arm includes doped silicon as a phase tuner.

5. The semiconductor photonic device of claim 2, wherein the gain region includes the III-V material selected from a group consisting of aluminum (Al), gallium (Ga), indium (In), nitrogen (N), phosphorus (P), arsenic (As), antimony (Sb), AlAs, GaAs, $In_xGa_{1-x}As$, $In_xAl_{1-x}As$, $In_xGa_{1-x}P$, $In_xAl_{1-x}P$, $GaAs_xSb_{1-x}$, $Al_xGa_{1-x}As_yP_{1-y}$, and $Al_xIn_yGa_{1-x-y}As$, where x and y are between 0 and 1, InSb, InAs, AlP, GaP, InP, a binary III-V compound, a ternary III-V compound, and a quaternary III-V compound.

6. The semiconductor photonic device of claim 1, wherein the semiconductor layer includes silicon, or an III-V material.

7. The semiconductor photonic device of claim 1, wherein the front reflector, the first back reflector, the second back reflector, or the third back reflector includes a loop mirror having silicon, a metal reflector, or a grating-based reflector.

8. The semiconductor photonic device of claim 7, wherein the first back reflector, the second back reflector, or the third back reflector is a loop mirror that includes doped silicon as a phase tuner.

9. The semiconductor photonic device of claim 1, further comprising:
a cladding layer disposed above the gain region and the semiconductor layer.

10. The semiconductor photonic device of claim 9, wherein the metal layer is disposed above the cladding layer.

11. The semiconductor photonic device of claim 1, wherein the semiconductor photonic device is provided for a single mode laser device.

12. The semiconductor photonic device of claim 1, wherein the MMI coupler is a self-imaging, lossless MMI coupler.

13. The semiconductor photonic device of claim 1, wherein the fine tuning arm is longer than the coarse tuning arm and longer than the SMSR and power tuning arm.

14. A method for forming a semiconductor photonic device, comprising:
forming a 1×3 multi-mode interference (MMI) coupler with an output port at a first side of the MMI coupler, and three input ports at a second side of the MMI coupler opposite to the first side, wherein the MMI coupler is within a semiconductor layer above a substrate;
forming, within the semiconductor layer, a front arm coupled to the output port of the MMI coupler and terminated by a front reflector, including coupling the output port with the front reflector via a waveguide;
integrating a photodetector into the waveguide between the front reflector and the output port to monitor power at the output port;
forming, within the semiconductor layer, a coarse tuning arm coupled to a first input port of the MIMI coupler and terminated by a first back reflector for coarse wavelength tuning, a fine tuning arm coupled to a second input port of the MMI coupler and terminated by a second back reflector for fine wavelength tuning, and a side-mode suppression ratio (SMSR) and power tuning arm coupled to a third input port of the MMI coupler and terminated by a third back reflector;
forming a gain region in an III-V material layer including an III-V material above the semiconductor layer, wherein the gain region is above the front arm; and
disposing a metal layer above the gain region, wherein the metal layer includes one or more metal heaters, including disposing the one or more metal heaters directly above the coarse tuning arm, the fine tuning arm, or the SMSR and power tuning arm in order to act as phase tuners for the semiconductor photonic device.

15. The method of claim 14, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide; and wherein the first back reflector, the second back reflector, or the third back reflector is a loop mirror; and the method further comprises:
forming doped silicon as a phase tuner for the silicon waveguide of the coarse tuning arm, the fine tuning arm, or the SMSR and power tuning arm; and
forming doped silicon at the loop mirror of the first back reflector, the second back reflector, or the third back reflector as a phase tuner.

16. The method of claim 14, wherein the gain region including the III-V material is bonded to the semiconductor layer by direct bonding, eutectic bonding, or hybrid bonding.

17. The method of claim 14, further comprising:
forming a cladding layer above the gain region and the semiconductor layer, wherein
the metal layer is disposed above the cladding layer.

18. An optical communication system comprising at least one optical apparatus, wherein the optical apparatus includes a single mode laser device, and the single mode laser device includes:
a substrate;
a gain region above the substrate, wherein the gain region includes an III-V material;
a semiconductor layer above the substrate and below the gain region, wherein the semiconductor layer includes:
a 1×3 multi-mode interference (MIMI) coupler,
a front arm coupled to the MMI coupler and terminated by a front reflector at a first side of the MIMI coupler,
a coarse tuning arm terminated by a first back reflector for coarse wavelength tuning,
a fine tuning arm terminated by a second back reflector for fine wavelength tuning, and a side-mode suppression ratio (SMSR) and power tuning arm terminated by a third back reflector, wherein the gain region is above the front arm, and wherein the coarse tuning arm, the fine tuning arm, and the SMSR and power tuning arm are coupled to the MMI coupler at a second side of the MIMI coupler opposite to the first side;
an output port coupled to the front reflector via a waveguide; and
a photodetector integrated into the waveguide between the front reflector and the output port to monitor power at the output port; and
a metal layer disposed above the gain region, wherein the metal layer includes one or more metal heaters, wherein the one or more metal heaters are disposed directly above the coarse tuning arm, the fine tuning arm, or the SMSR and power tuning arm in order to act as phase tuners for the optical apparatus.

19. The optical communication system of claim 18, wherein the semiconductor layer includes silicon, or an III-V material; and wherein the gain region includes the III-V material selected from a group consisting of aluminum (Al), gallium (Ga), indium (In), nitrogen (N), phosphorus (P), arsenic (As), antimony (Sb), AlAs, GaAs, $In_xGa_{1-x}As$, $In_xAl_{1-x}As$, $In_xGa_{1-x}P$, $GaAs_xSb_{1-x}$, $Al_xGa_{1-x}As_yP_{1-y}$, and $Al_xIn_yGa_{1-x-y}As$ where x and y are between 0 and 1, InSb, InAs, AlP, GaP, InP, a binary III-V compound, a ternary III-V compound, and a quaternary III-V compound.

20. The optical communication system of claim 18, wherein the front arm, the coarse tuning arm, the fine tuning arm, or the SMSR and power tuning arm includes a silicon waveguide selected from a group consisting of a slab waveguide, a strip waveguide, a rib waveguide, or a surface ridge waveguide; and the silicon waveguide of the coarse tuning arm, the fine tuning arm, or the SMSR and power tuning arm includes doped silicon as a phase tuner.

21. The optical communication system of claim 18, wherein the first back reflector, the second back reflector, or the third back reflector is a loop mirror that includes doped silicon as a phase tuner.

22. The optical communication system of claim 18, wherein the single mode laser device further comprises:

a cladding layer disposed above the gain region and the semiconductor layer; and, wherein the metal layer is disposed above the cladding layer.

* * * * *

UNITED STATES PATENT AND TRADEMARK OFFICE
CERTIFICATE OF CORRECTION

Page 1 of 1

PATENT NO. : 11,143,818 B2
APPLICATION NO. : 16/457483
DATED : October 12, 2021
INVENTOR(S) : Meer Nazmus Sakib et al.

It is certified that error appears in the above-identified patent and that said Letters Patent is hereby corrected as shown below:

In the Claims

Column 14
Line 40 "...a first side of the MIMI coupler," should read --...a first side of the MMI coupler,--

Column 15
Line 62 "...a first input port of the MIMI coupler" should read --...a first input port of the MMI coupler--

Column 16
Line 43 "a 1×3 multi-mode interference (MIMI) coupler," should read --a 1×3 multimode interference (MMI) coupler,--
Line 45 "...a first side of the MIMI coupler," should read --...a first side of the MMI coupler,--
Line 55 "a second side of the MIMI coupler..." should read --a second side of the MMI coupler...--

Column 17
Line 7 "...InxGa1-xP, GaAsxSb1-x..." should read --...InxGa1-xP, InxAl1-xP, GaAsxSb1-x...--
Line 27 "semiconductor layer; and, wherein" should read --semiconductor layer, wherein--

Signed and Sealed this
Seventh Day of January, 2025

Derrick Brent
*Acting Director of the United States Patent and Trademark Office*